United States Patent [19]

Tsuchibuchi et al.

[11] 4,240,880
[45] Dec. 23, 1980

[54] METHOD AND APPARATUS FOR SELECTIVELY PLATING A MATERIAL

[75] Inventors: Akira Tsuchibuchi, Sayama; Takashi Kobayashi, Itsukaichimachi, both of Japan

[73] Assignee: Sumitomo Metal Mining Co., Ltd., Tokyo, Japan

[21] Appl. No.: 56,639

[22] Filed: Jul. 11, 1979

[30] Foreign Application Priority Data

Jul. 25, 1978 [JP] Japan .................................. 53/90650

[51] Int. Cl.³ .......................... C25D 5/02; C25D 17/02
[52] U.S. Cl. .................................... 204/15; 204/224 R
[58] Field of Search ............................. 204/15, 224 R

[56] References Cited

U.S. PATENT DOCUMENTS

| 3,763,027 | 10/1973 | Pearson | 204/224 R |
| 4,083,755 | 4/1978 | Murata | 204/15 |
| 4,126,553 | 11/1978 | Lukyanchikov | 204/224 R |

FOREIGN PATENT DOCUMENTS

| 2508777 | 9/1976 | Fed. Rep. of Germany | 204/224 R |
| 527912 | 10/1972 | Switzerland | 204/224 R |

*Primary Examiner*—T. M. Tufariello
*Attorney, Agent, or Firm*—Watson, Cole, Grindle & Watson

[57] ABSTRACT

A method and apparatus for selectively plating a material using an elastic mask plate having an opening of a shape defining a portion of the material to be plated provided on an outer case. The upper lid of the outer case has a through-hole of a shape substantially equal to that of at least one portion to be plated. The material to be plated is held between the elastic mask plate and an elastic pressing plate which is capable of pressing the material to be plated into contact with the elastic mask plate. A plating solution is jetted onto the exposed portion of the material to be plated through a plating solution jetting port of a nonelectro-conductive nozzle plate in the upper portion of an inner case located within the outer case. The plating solution jetting port of the nozzle plate is of a desired shape and in a position corresponding to the portion of the material to be plated. A soluble anode of the plating element is also located within the inner case and a plating solution feeding tube having small orifices for jetting the plating solution projects into the inner case. The feeding tube jets the plating solution onto the material to be plated by uniformly jetting the plating solution through the small orifices toward the soluble anode.

By the use of the above-described method for selectively plating a material, the feeding of a metallic salt is not required during the plating, undesirable oxidizing reactions will not occur on the anode surface, and a nozzle plate corresponding to the portion of the material to be plated can be easily and inexpensively fabricated.

10 Claims, 6 Drawing Figures

METHOD AND APPARATUS FOR SELECTIVELY PLATING A MATERIAL

BACKGROUND OF THE INVENTION

1. Field of the Invention

The present invention relates to an improved method and apparatus for electively plating a material and, specifically, to a method and apparatus for plating selective locations on one surface of a metal plate.

2. Description of the Prior Art

As an example, the semiconductor chip bonding portions and the wire bonding portions of a lead frame for semiconductor devices must be plated with gold or silver. Since such plating elements are costly, present practice is to plate only the necessary portions of the frame.

A method and apparatus for selectively plating a material used for such purposes are explained in the following with reference to the drawings where FIGS. 1A and 1B are views showing an internal structure of a conventional apparatus for selectively plating a material. FIG. 1A is a cross-sectional view taken along line IA—IA of FIG. 1B and FIG. 1B is a cross-sectional view taken along line IB—IB of FIG. 1A. In these Figures, outer case 2 having discharge pipe 1 in the bottom includes upper lid 4 provided with one or more through-holes 3. Sealing rubber plate 6 having common openings 5 of a shape defining the portions to be plated, mask supporting plate 7 and mask plate 8 are mounted on upper lid 4. Sealing rubber plate 6, mask supporting plate 7 and mask plate 8 are adhered together by a binder so as to be an integral member independent of outer case 2. Pressing plate 11 with rubber plate 10 adhered to the lower surface is adapted to be movable up and down by suitable means as an air cylinder. Then, material 9 to be plated is mounted on mask plate 8 with the portions to be plated positioned to accurately concide with the openings 5. Pressing plate 11 is then pressed down to bring mask plate 8 and rubber plate 10 into close contact with the material 9 to be plated.

In the bottom of inner case 12 contained within outer case 2 is plating solution feeding pipe 13 connected to a plating solution circulating pump (not shown). Located in the upper portion of inner case 12 are nozzles 14 having respective circular plating solution jetting ports in positions corresponding to through-holes 3 in upper lid 4. Inner case 12 is further provided with baffle 15 for controlling the flow of the plating solution. A material insoluble in the plating solution such as, for example, platinum or titanium coated with platinum is used for nozzles 14 so that an electric current may be passed simultaneously with the jetting of the plating solution by using the nozzles as anodes and material 9 to be plated as a cathode.

A defect of the conventional method and apparatus is that, since the anode is insoluble, the amount of metal ions of the plating element in the plating solution will be reduced as the plating is continued. Therefore a metallic salt which contains the plating element must be added to the solution from time to time. A second defect is caused by the insoluble anode the same as in the first defect and occurs as a result of anode oxidation on the nozzle surface. For example, when the plating solution is a cyanide bath, cyanide ions ($CN^-$) will be decomposed into carbonate ions ($CO_3^{2-}$) and nitrogen gas ($N_2$). As a consequence, the cyanide ion concentration will be reduced and the carbonate ion concentration will increase. However, although the reduced cyanidle ion concentration can be compensated by the addition of potassium cyanide (KCN) or sodium cyanide (NaCN), the carbonate ion concentration will continue to increase further until normal plating is significantly obstructed. Therefore it is necessary to renew the plating solution before such obstruction occurs.

A third defect is that since the shapes of the portions to be plated on material 9 vary depending on the particular use of the material, difficulties may be encountered in obtaining uniformity in the plating. For example, if the shape of the portion to be plated is circular, a plating of a sufficiently uniform thickness can be made with a circular nozzle such as nozzle 14 in the conventional plating apparatus. However, if, for example, the shape of the portion to be plated is rectangular and a circular nozzle is utilized, the amount of the plating solution fed to the vicinity of the short side of the rectangle will be insufficient and thus the plated thickness will be large in the center but thin on the short side of the plating. Therefore, it is desirable to use a nozzle corresponding in shape to the portion to be plated in order to produce a plating of uniform thickness. However, as was mentioned above, nozzle 14 in the conventional apparatus for selectively plating a material is of platinum and is therefore quite expensive. Consequently, it has been prohibitively expensive to maintain an inventory of the many types of nozzles corresponding to the types of shapes of the portions to be plated.

SUMMARY OF THE INVENTION

An object of the present invention is to provide a method and apparatus for selectively plating a material wherein such conventional defects are eliminated. In accordance with the present invention, it is not necessary to compensate the plating element with additional metallic salt, the life of the plating solution can be extended, and the nozzle can be easily and economically varied in response to the variation of the shape of the portion to be plated so that a stable plating of a uniform thickness can be produced on a material regardless of shape.

Briefly, the present invention comprehends a method for selectively plating a material which comprises holding the material between an elastic mask plate member on the outer case having an upper lid containing a through-hole of a shape substantially the same as the portion to be plated and having an opening of a shape defining the portion to be plated and an elastic pressing plate member which presses the material to be plated into contact with the mask member, and jetting a plating solution onto the exposed portion of the material to be plated through a plating solution jetting port within a nonelectroconductive nozzle plate mounted in an inner case located within the outer case, the plating solution jetting port being of a desired shape and in a position corresponding to the portion of the material to be plated, the jetting of the plating solution through the jetting port being caused by a uniform jetting of the plating solution from a plating solution feeding tube inserted in the inner case toward a soluble anode of plating element located within the inner case.

The present invention also comprehends an apparatus for selectively plating a material which comprises an outer case having an upper lid which contains a through-hole of a shape substantially equal to that of at least one portion of the material to be plated, an elastic mask plate member having an opening of a shape defining the portion to be plated over the upper lid, a movable elastic pressing plate member adapted to press and hold the material to be plated in contact with the mask plate member, an inner case within the outer case, a nonelectroconductive nozzle plate mounted in the upper portion of the inner case and having a plating solution jetting port to jet a plating solution onto the exposed portion of the material to be plated, the plating solution jetting port having a shape and position corresponding to the portion to be plated, a replaceable soluble anode of the plating element located within the inner case, and a plating solution feeding tube having means which can jet the plating solution uniformly toward the anode.

DETAILED DESCRIPTION OF PREFERRED EMBODIMENTS

Figure 1A:
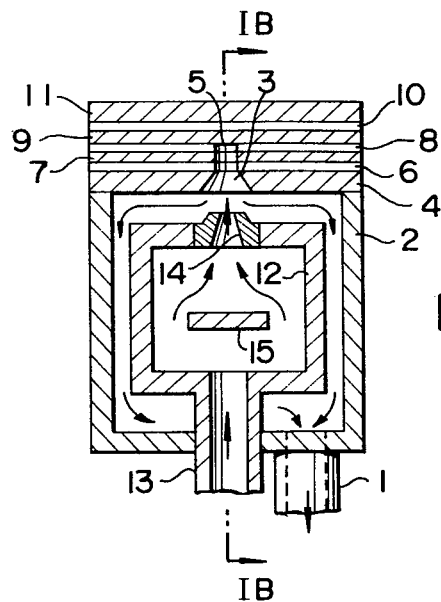
FIG. 1A is a cross-sectional view along line IA—IA in FIG. 1B which shows the internal structure of a conventional apparatus for selectively plating a material.
Figure 1B:
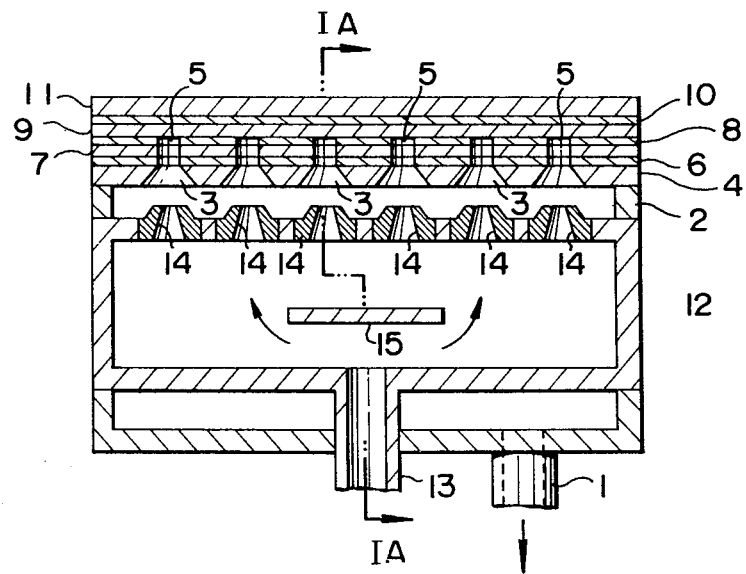
Figure 2A:
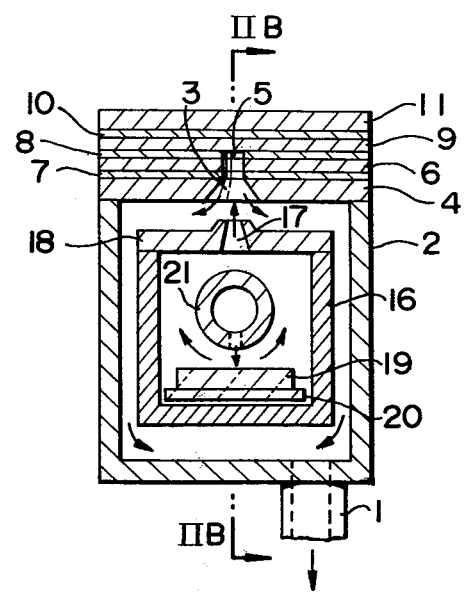
FIG. 2A is a cross-sectional view taken along line IIA—IIA in FIG. 2B, which shows one embodiment of the internal structure of an apparatus for selectively plating a material in accordance with the present invention.
Figure 2B:
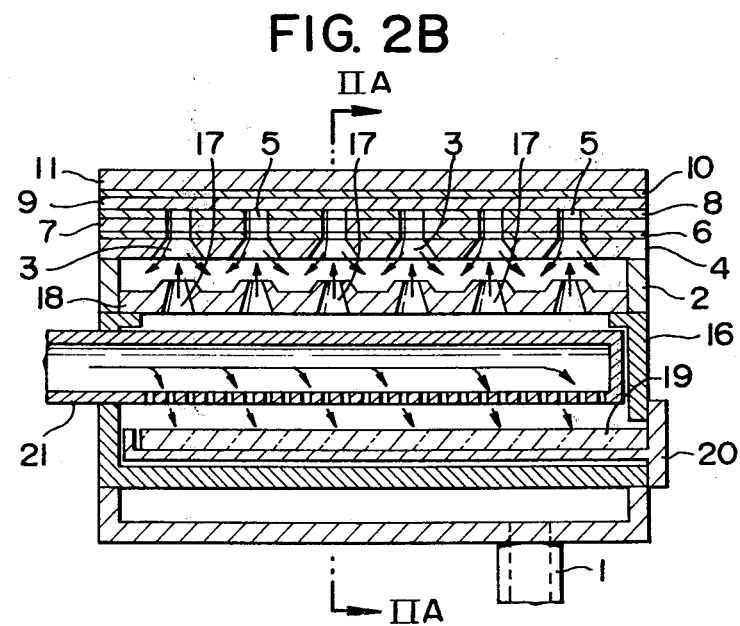
FIG. 2B is a cross-sectional view taken along line IIB—IIB in FIG. 2A.

An embodiment of the present invention will be explained in detail hereinafter with reference to the drawings where FIGS. 2A and 2B are cross-sectional side views of an apparatus for selectively plating a material in accordance with the present invention. Specifically, FIG. 2A is a cross-sectional view taken along line IIA—IIA in FIG. 2B and FIG. 2B is a cross-sectional view taken along line IIB—IIB in FIG. 2A.

In FIGS. 2A and 2B, outer case 2 has discharge pipe 1 located in the bottom portion and upper lid 4 on the upper portion. Upper lid 4 is provided with one or more through-holes 3. Mounted on upper lid 4 are sealing rubber plate 6, mask supporting plate 7 and mask plate 8 each having common openings 5 of a shape defining portions to be plated. Mask plate 8 is made of flexible, elastic, acid-proof and alkali-proof rubber or synthetic resin such as silicone rubber or silicone resin. Mask plate 8 and sealing rubber plate 6 are adhered respectively above and below the above-mentioned mask supporting plate 7 so as to be integral therewith. Pressing plate 11 having a rubber plate 10 adhered to its lower surface plate 10 adhered to its lower surface is connected to suitable means such as an air cylinder (not illustrated) so as to be movable up and down. Material 9 to be plated and which acts as a cathode is mounted on mask plate 8 so that openings 5 of the mask plate accurately coincide with the portions to be plated. Then pressing plate 11 is pressed down to bring material 9 to be plated into close contact with both mask plate 8 and with rubber plate 10. As is apparent, the construction of outer case 2 and the upper portion of the outer case is substantially the same as the previously-described conventional apparatus.

However, contained within outer case 2 is inner case 16 and nozzle plate 18 made of a nonelectroconductive synthetic resin. Nozzle plate 18 has plating solution jetting ports 17 of appropriate shapes and is removably mounted on the upper portion of inner case 16. The number and position of the through-holes 3 of upper lid 4, of common openings 5 in sealing rubber plate 6, mask supporting plate 7 and mask plate 8 and of plating solution jetting ports 17 of nozzle plate 18 correspond respectively to the number and position of the portions to be plated on material 9. A flat plate-shaped soluble anode 19 of a plating element such as gold or silver is mounted on supporting base 20 and is located on the side opposed to nozzle plate 18 such as, for example, the bottom surface of inner case 16. Soluble anode 19 can be replaced as required by pulling out supporting base 20 from one side in the lengthwise direction.

Plating solution feeding tube 21 connected to a plating solution circulating pump (not shown) is inserted in the lengthwise direction from the opposite side of the inner case 16. Tube 21 has, for example, a plurality of small orifices so that a plating solution may be jetted uniformly onto soluble anode 19. An electric current can be passed simultaneously with the jetting of the plating solution by using soluble anode 19 as the anode and material 9 to be plated as the cathode. In use of the present apparatus, as inner case 16 is filled with the solution, the plating solution will jet substantially uniformly onto soluble anode 19 through the small orifices (located on the lower side of the tube in this embodiment) of plating solution feeding tube 21. The plating solution will then electrochemically dissolve the anode, will flow in the directions indicated by the arrows in the drawing and then jet substantially uniformly out of plating solution jetting ports 17 of nozzle plate 18. Nozzle plate 18 can be easily replaced in response to the differing shapes of the portions to be plated.

For convenience, the above-described embodiment illustrates an example of the selective plating of a material where one inner case is contained in an outer case and is provided with one plating solution feeding tube and only one material to be selectively plated. In order to selectively plate many materials in one operation, it is advantageous to provide a plurality of inner cases in one large outer case. Each case may have a plurality of plating solution feeding tubes and the plating solution jetting ports may be arranged in response to the plating soltuion feeding tubes.

Figure 3:
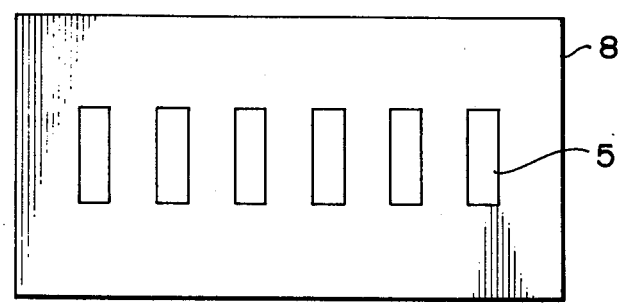
FIG. 3 is a plan view showing an embodiment of a mask plate to be used in an apparatus of the present invention.
Figure 4:
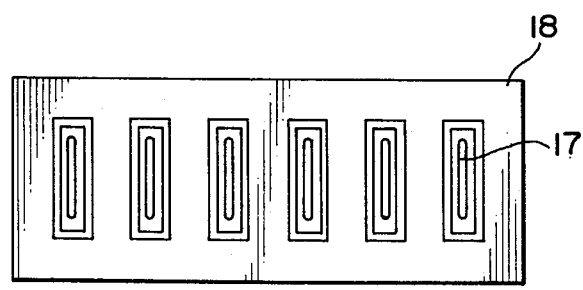
FIG. 4 is a plan view of a nozzle which corresponds to the mask plate of FIG. 3.

As previously explained in detail, according to the present invention, the amount of metal electrodeposited on the material to be plated, which is the same as in conventional plating, will be dissolved and compensated by the anode. Therefore the metal ion concentration in the circulated plating solution will not vary substantially and it is totally unnecessary to add a metallic salt which is more expensive than the unit metal. Furthermore, since the anode is soluble, undesirable anode oxidizing reactions will not occur on the anode surface and therefore no undesirable products will be produced and the life of the plating solution can be greatly extended. In addition, since the nozzle plate may be of a generally acid-proof and alkali-proof synthetic resin which can be made comparatively inexpensively and easily, when using mask plate 8 such as is shown, for example, in FIG. 3, a nozzle plate having plating solution jetting ports 17 of shapes such as shown in FIG. 4 can be used and thus a nozzle plate corresponding to the shapes of the portions to be plated can be economically prepared. Consequently, even a material having portions to be plated of such shapes that cannot be plated to a uniform thickness by conventional methods can be plated to be of a uniform thickness by the subject method and apparatus.

While the present invention has been described with reference to particular embodiments thereof, it will be understood that numerous modifications may be made by those skilled in the art without actually departing from the spirit and scope of the invention as defined in the appended claims.

We claim:

1. In an apparatus for selectively plating a material which comprises an outer case having an upper lid which contains a through-hole of a shape substantially equal to that of at least one portion of the material to be plated, an elastic mask plate member having an opening of a shape defining the portion to be plated over the upper lid, a movable elastic pressing plate member adapted to press and hold the material to be plated in contact with the mask plate member, an inner case within the outer case, said inner case having an upper wall and a lower wall, at least one nonelectroconductive nozzle plate mounted in the upper wall of the inner case and forming at least one plating solution jetting port to jet a plating solution onto the exposed portion of the material to be plated, each plating solution jetting port having a shape and position corresponding to the portion to be plated, the improvement wherein a replaceable soluble anode of the plating element is located with said inner case, and a plating solution feeding tube is also located within said inner case, said feeding tube including means for jetting the plating solution uniformly toward said replaceable soluble anode.

2. The apparatus according to claim 1 wherein said nozzle plate is of a nonelectroconductive synthetic resin.

3. The apparatus according to claim 1 wherein said means for jetting the plating solution from said plating solution feeding tube toward said anode comprises a plurality of orifices located in spaced apart fashion along said feeding tube.

4. The apparatus according to claim 1 wherein said soluble anode is in the form of a flat plate.

5. The apparatus according to claim 1 wherein said soluble anode is in the form of a flat plate and is located adjacent the bottom wall of said inner case and wherein the plating solution is jetted uniformly toward the upper surface of said flat plate-shaped anode through orifices in said plating solution feeding tube.

6. The apparatus according to claim 1 wherein said elastic mask plate member comprises a mask-supporting plate, a mask plate adhered to the upper surface of the mask-supporting plate and a sealing rubber plate adhered to the lower surface of the mask-supporting plate.

7. The apparatus according to claim 6 wherein said mask plate is composed of flexible elastic material.

8. The apparatus according to claim 1 wherein said elastic pressing plate member comprises a pressing plate and a rubber plate adhered to the lower surface of the pressing plate.

9. An apparatus for selectively plating a material comprising an outer case having an upper lid containing a through-hole of a shape substantially euqal to that of at least one portion of the material to be plated, an elastic mask plate member having an opening of a shape defining the portion to be plated located on said upper lid, a movable elastic pressing plate member capable of pressing and holding the material to be plated in contact with said mask plate, at least one inner case provided within said outer case, each inner case containing a nonelectroconductive nozzle plate having at least one upwardly directed plating solution jetting port capable of jetting a plating solution onto the exposed portion of the material to be plated, a flat plate-shaped replacement soluble anode located at the bottom of said inner case, and at least one plating solution feeding tube in the inner case located above said anode and having a plurality of orifices capable of uniformly jetting the plating solution toward the upper surface of the anode.

10. A method for selectively plating a material comprising holding the material between an elastic mask plate member on an outer case having an upper lid containing a through-hole of a shape substantially the same as the portion to be plated and having an opening of a shape defining said portion to be plated and an elastic pressing plate member which presses the material to be plated into contact with said mask plate member, and jetting a plating solution onto the exposed portion of the material to be plated through a plating solution jetting port within a nonelectroconductive nozzle plate mounted in an inner case located within said outer case, said plating solution jetting port being of a desired shape and in a position corresponding to the portion of the material to be plated, said jetting of the plating solution through the jetting port being caused by a uniform jetting of the plating solution from a plating solution feeding tube inserted in the inner case toward a soluble anode of plating element located within the inner case.

* * * * *